United States Patent [19]

Jacob et al.

[11] Patent Number: 4,951,052
[45] Date of Patent: Aug. 21, 1990

[54] CORRECTION OF SYSTEMATIC ERROR IN AN OVERSAMPLED ANALOG-TO-DIGITAL CONVERTER

[75] Inventors: Philippe L. Jacob, Clifton Park; Steven L. Gaverick, Schenectady, both of N.Y.

[73] Assignee: General Electric Company, Schenectady, N.Y.

[21] Appl. No.: 378,557

[22] Filed: Jul. 10, 1989

[51] Int. Cl.⁵ .................................... H03M 3/04
[52] U.S. Cl. ................................ 341/122; 341/118; 341/143; 341/155; 375/28
[58] Field of Search ............... 341/122, 120, 118, 143, 341/155; 375/28, 33

[56] References Cited

U.S. PATENT DOCUMENTS

| | | | |
|---|---|---|---|
| 4,542,354 | 9/1985 | Robinton et al. | 341/143 |
| 4,588,981 | 5/1986 | Senn | 341/167 |
| 4,647,905 | 3/1987 | Hantke et al. | 341/118 |
| 4,684,925 | 8/1987 | Maruta | 341/166 |
| 4,694,277 | 9/1987 | Takahashi | 341/118 |
| 4,704,600 | 11/1987 | Uchimura et al. | 341/122 |
| 4,775,851 | 10/1988 | Borth | 341/155 |
| 4,843,390 | 6/1989 | van Bavel et al. | 341/120 |
| 4,851,841 | 7/1989 | Sooch | 375/28 |
| 4,862,169 | 8/1989 | van Bavel et al. | 341/143 |
| 4,876,542 | 10/1989 | van Bavel et al. | 341/143 |
| 4,876,543 | 10/1989 | van Bavel | 341/123 |
| 4,876,544 | 10/1989 | Kuraishi | 341/122 |

Primary Examiner—William M. Shoop, Jr.
Assistant Examiner—Gary J. Romano
Attorney, Agent, or Firm—Allen L. Limberg; James C. Davis, Jr.; Marvin Snyder

[57] ABSTRACT

A method for performing oversampled analog-to-digital conversion of an input signal to generate a conversion result signal essentially free of systematic errors in accordance with the invention includes the steps of: performing oversampled analog-to-digital conversion of the input signal to generate a preliminary conversion result signal accompanied by systematic error, performing oversampled analog-to-digital conversion of a zero-valued signal to generate a correction signal essentially consisting of a corresponding systematic error, and differentially combining the correction signal and the preliminary conversion result signal to generate the conversion result essentially free of systematic errors. In a structural embodiment of the invention the systematic error in an oversampled analog-to-digital converter is suppressed by subtracting from the conversion response the response of a similar oversampled analog-to-digital converter to the reference voltage as its analog input signal.

2 Claims, 2 Drawing Sheets

CORRECTION OF SYSTEMATIC ERROR IN AN OVERSAMPLED ANALOG-TO-DIGITAL CONVERTER

The invention relates to oversampled analog-to-digital converters of the delta-sigma type and, more particularly, to correcting systematic errors arising therein.

BACKGROUND OF THE INVENTION

In a single-ended delta-sigma analog-to-digital converter an error signal is integrated over time to generate an integrator response voltage that is then compared to the reference voltage, which comparison is performed with single-bit resolution at oversampling rate. The oversampled digital response of the converter is supplied to a digital decimation filter, such as afforded by a regularly read and then reset digital counter, to generate the analog-to-digital converter response at normal sampling rate. The oversampled digital response of the converter is also converted to an analog feedback signal voltage, which is differentially combined with the analog input signal voltage in generating the error signal. A commonplace practice is to obtain the analog feedback signal voltage from the output port of a data flip-flop receiving the oversampled digital response at its data input port.

A systematic error in a signed analog-to-digital conversion response occurs when the voltage at the output port of the the data flip-flop switches between two operating supply voltages that do not exactly average to the direct reference voltage. This can occur because the circuitry to develop a reference voltage midway between the two operating supply voltages is kept very simple to keep hardware costs very low. In such case the reference voltage is likely to depart from exactly the average of the data flip-flop output voltage range, which departure will appear as a systematic error in the conversion result.

In digital electronic circuit breakers or in digital electronic power meters, for example, twelve-bit accuracies are sought on the oversampled analog-to-digital converters included therein. These accuracies cannot be achieved when reference voltages are obtained by simple potential dividing circuits.

SUMMARY OF THE INVENTION

The objective of the invention is to permit the source of reference voltage in a signed, single-ended over-sampled analog-to-digital converter to supply reference voltage that departs from optimum value without incurring a systematic error caused by such departure. A method for performing oversampled analog-to-digital conversion of an input signal to generate a conversion result signal essentially free of systematic errors in accordance with the invention includes the steps of: performing oversampled analog-to-digital conversion of the input signal to generate a preliminary conversion result signal accompanied by systematic error, performing oversampled analog-to-digital conversion of a zero-valued signal to generate a correction signal essentially consisting of a corresponding systematic error, and differentially combining the correction signal and the preliminary conversion result signal to generate the conversion result essentially free of systematic errors. In a structural embodiment of the invention the systematic error in an oversampled analog-to-digital converter is suppressed by subtracting from the conversion response the response of a similar oversampled analog-to-digital converter that has the reference voltage as its analog input signal.

DETAILED DESCRIPTION

Figure 1:
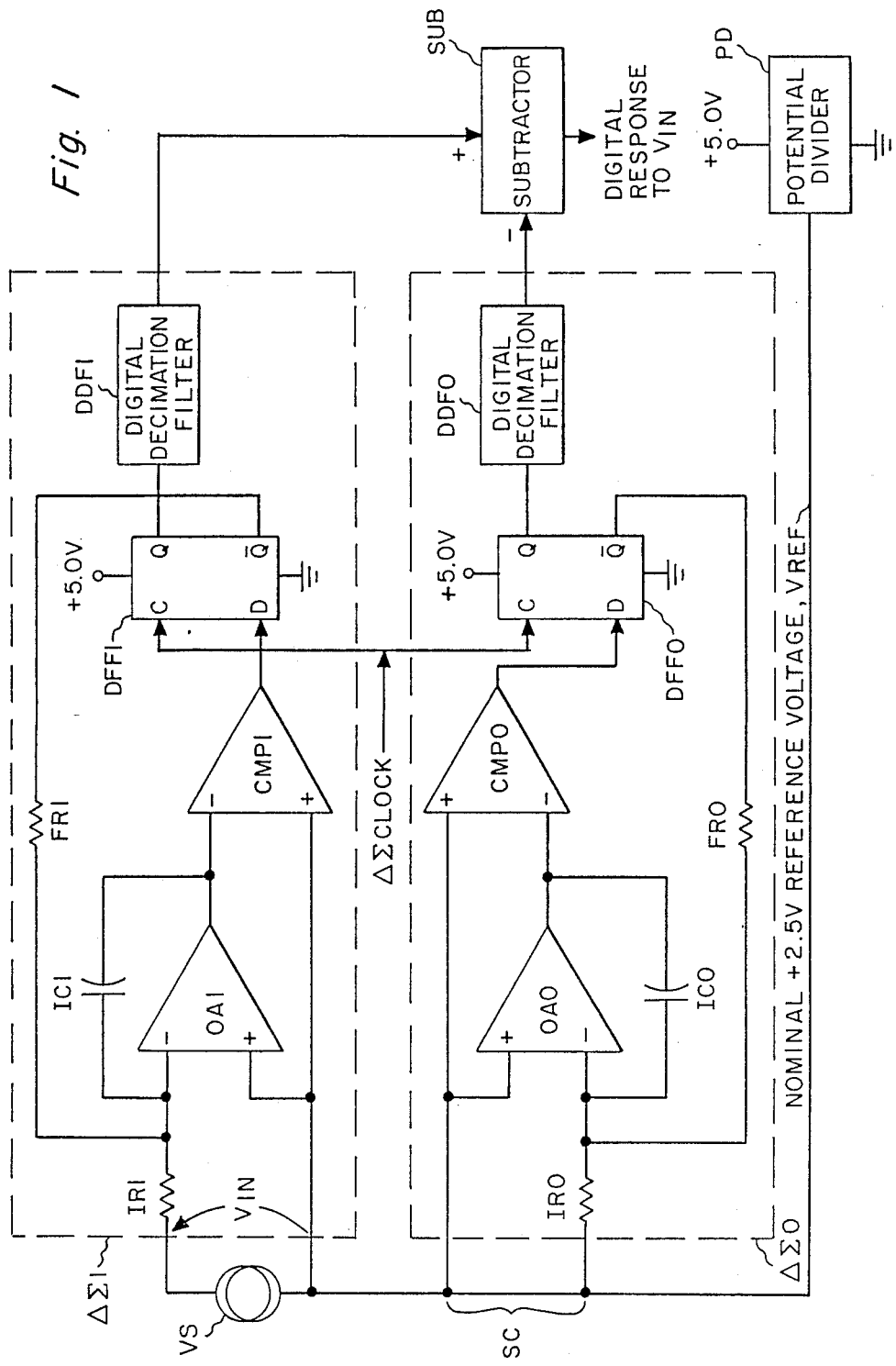
FIG. 1 is a schematic diagram of an oversampled analog-to-digital converter embodying the invention.

In FIG. 1 a first delta-sigma analog-to-digital converter $\Delta\Sigma 1$ is used to provide digital responses at a normal sampling rate to an analog input signal voltage $V_{IN}$ supplied from a voltage source VS as in a prior-art oversampled analog-to-digital converter. Rather than using these digital responses without correcting for any error in a reference voltage $V_{REF}$ supplied to the converter $\Delta\Sigma 1$ from a potential divider PD, as is done in the prior-art converter, these digital responses are supplied to the minuend input port of a subtracter SUB, the difference output port of which provides the ultimate digital responses for the analog-to-digital conversion. The subtrahend input port of subtracter SUB receives a correction term that corrects for systematic errors.

A usual source of these systematic errors is the potential divider PD. Potential divider PD generates a reference voltage $V_{REF}$ that is nominally the average of the relatively negative and relatively positive operating supply voltages applied to a data flip-flop DFF1 used in the delta-sigma converter $\Delta\Sigma 1$, but which may actually depart somewhat from being the exact average of those two operating supply voltages. For example, if the relatively negative and relatively positive operating supply voltages are 0 and +5 volts respectively, the reference voltage $V_{REF}$ may depart slightly from the +2.5 volt value it nominally should have. This departure, $\delta$, gives rise to a systematic error in the digital responses that converter $\Delta\Sigma 1$ supplies to the minuend input port of subtracter SUB.

The delta-sigma converter $\Delta\Sigma 1$ includes an operational amplifier OA1 connected to function as a Miller integrator, with an integrating capacitor IC1 between its output port and its inverting input port. The Miller integrator voltage response is supplied from the output port of operational amplifier OA1 to the inverting input port of a digital comparator CMP1, to be compared to the reference voltage applied to the non-inverting input port of the comparator. If the Miller integrator voltage response is larger than reference voltage, digital comparator CMP1 output voltage is a logic ONE; if smaller, a logic ZERO.

A data flip-flop DFF1 responds to a regularly recurrent $\Delta\Sigma$clock signal to latch the comparator output signal, with the Q output signal of data flip-flop being set to the relatively positive operating supply voltage if comparator CMP1 output signal is a ONE and being reset to the relatively negative operating supply voltage if comparator CMP1 output signal is a ZERO. The $\overline{Q}$ output signal of data flip-flop DFF1 is complementary to its Q output signal. Data flip-flop DFF1 may be considered as being a digital-to-analog converter insofar as a degenerative feedback connection from comparator CMP1 output port to the inverting input port of operational amplifier OA1 is concerned. Data flip-flop DFF1 may be considered as a source of latched, single-bit-resolution, digital results insofar as a subsequent digital decimation filter DDF1 is concerned. Filter DDF1 responds to the oversampled output signal from data flip-flop DDF1 to provide digital response with multiple-bit-resolution at a normal sampling rate.

An input resistor IR1 connects in series with voltage source VS between the non-inverting and inverting input ports of operational amplifier OA1, and a feedback resistor FR1 connects between output port $\overline{Q}$ of the data flip-flop DFF1 and the inverting input port of operational amplifier OA1. The degenerative feedback that integrating capacitor IC1 provides maintains the inverting input connection of operational amplifier OA1 close to $V_{REF}$, so voltage source VS voltage $V_{IN}$ appears across input resistor IR1 to cause a current flow $V_{IN}/R$ to that inverting input connection, assuming the resistance of resistor IR1 to have the value R. If resistor FR1 has a similar resistance of value R, the average value of $\overline{Q}$ output of data flip-flop DFF1 being $V_{REF} - V_{IN}$ will cause current flow $V_{IN}/R$ from that inverting input connection of operational amplifier OA1, so there is no direct component of current flow to or from the Miller integrator connection of elements OA1 and IC1 to alter its voltage response as applied to voltage comparator CMP1.

When the average value of $\overline{Q}$ output of data flip-flop DFF1 is $V_{REF} - V_{IN}$, the average value of Q output of data flip-flop DFF1 has to be +5.0 volts positive operating supply voltage minus ($V_{REF} - V_{IN}$), since Q and $\overline{Q}$ output voltages always sum to that +5.0 positive operating supply voltage. That is, the average value of Q output of data flip-flop DFF1 will be $V_{IN} + (+5.0v - V_{REF})$. These average values are short term averages of oversampling taken over time periods such as those between digital decimation filter DDF1 output samples supplied at normal sampling rate.

If $V_{REF}$ is exactly +2.5 volts — that is, exactly midway between the +5-volt and 0-volt operating supply voltages, Q output voltage from data flip-flop DFF1 has an average value $V_{IN} + (5.0v - 2.5v) = V_{IN} + 2.5v$. That is, the offset voltage added to $V_{IN}$ in the conversion result supplied from digital decimation filter DDF1 output port is exactly $V_{REF} = 2.5$ volts, as desired.

If $V_{REF}$ is +2.5 volts plus a departure $-\delta$, however, Q output voltage from data flip-flop DFF1 has an average value $V_{IN} + [+5.0v - (2.5v - \delta)] = V_{IN} + 2.5v + \delta$. The offset voltage added to $V_{IN}$ in the conversion result supplied from digital decimation filter DDF1 output port errs by a departure $\delta$. This departure $\delta$ is the systematic error in the conversion results which the invention seeks to eliminate.

Another delta-sigma modulator $\Delta\Sigma 0$ has elements IR0, OA0, IC0, CMP0, DDF0, FR0 and DFF0 respectively very much similar to elements IR1, OA1, IC1, CMP1, DFF1, FR1 and DDF1 of the first delta-sigma modulator $\Delta\Sigma 1$ in operating characteristics, and in similar connection with each other. The other delta-sigma modulator $\Delta\Sigma 0$ has a short circuit SC, rather than a voltage source corresponding to VS, connected across its input port. Accordingly, the other delta-sigma modulator $\Delta\Sigma 0$ responds to the reference voltage $V_{REF}$ itself as input signal to generate a digital output signal at normal sampling rate, which digital output signal is descriptive of the systematic error $\delta$ and is supplied as the subtrahend signal to subtracter SUB. The difference signal supplied from the output port of subtracter SUB is free of the systematic error $\delta$ applied to each of its input ports, accomplishing the objective of the invention.

Figure 2:
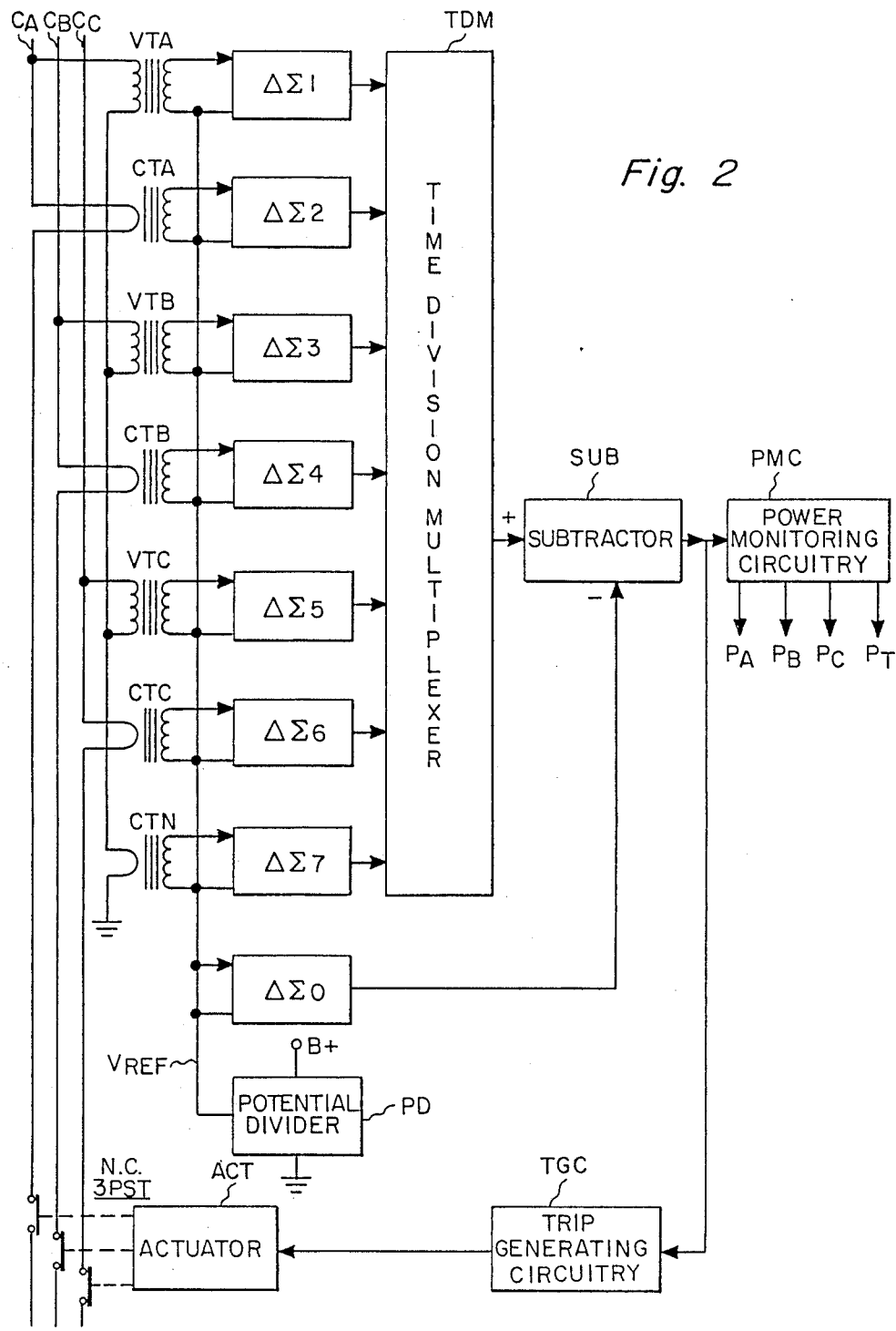
FIG. 2 is a schematic diagram of a digital electronic circuit breaker and power meter for three-phase power, which embodies the invention.

FIG. 2 shows a digital electronic circuit breaker and power meter for three-phase operation which embodies the invention thus far described. In FIG. 2 potential divider PD supplies reference voltage $V_{REF}$ to delta-sigma analog-to-digital converters $\Delta\Sigma 2$, $\Delta\Sigma 3$, $\Delta\Sigma 4$, $\Delta\Sigma 5$, $\Delta\Sigma 6$ and $\Delta\Sigma 7$ as well as to analog-to-digital converters $\Delta\Sigma 0$ and $\Delta\Sigma 1$. The conductors CA, CB and CC conduct respective phase of three-phase power unless selectively interrupted by a normally conducting three-pole-single-throw switch 3PST responding to an electromechanical actuator ACT energized by an electric trip signal.

Voltage transformers VTA, VTB and VTC have respective primary windings in star connection to the three-phase power conductors CA, CB and CC. The voltage transformers VTA, VTB and VTC have respective secondary windings connected at first ends thereof to supply analog voltages responsive to phase voltages to delta-sigma analog-to-digital converters $\Delta\Sigma 1$, $\Delta\Sigma 3$ and $\Delta\Sigma 5$, respectively, and connected at second ends thereof to receive reference voltage $V_{REF}$ from potential divider PD. Current transformers CTA, CTB and CTC have respective primary windings provided by segments of the three-phase power conductors CA, CB and CC, respectively. The current transformers CTA, CTB and CTC have respective secondary windings connected at first ends thereof to apply analog voltages responsive to phase currents to delta-sigma analog-to-digital converters $\Delta\Sigma 2$, $\Delta\Sigma 4$ and $\Delta\Sigma 6$, respectively, and connected at second ends thereof to receive reference voltage $V_{REF}$ from potential divider PD. Neutral current flowing from the center of the star connection of the primary windings of the voltage transformers VTA, VTB and VTC to ground is sensed in the primary winding of current transformer CTN to provide at a secondary winding of transformer CTN an analog voltage that is added to $V_{REF}$ and applied as an input signal to delta-sigma analog-to-digital converter $\Delta\Sigma 7$.

Delta-sigma analog-to-digital converter $\Delta\Sigma 0$ digitizes $V_{REF}$ to generate a correction signal for $V_{REF}$ not being exactly the average of the B+ and ground voltages between which the digital-to-analog converter portions of the converter $\Delta\Sigma 1$, $\Delta\Sigma 2$, $\Delta\Sigma 3$, $\Delta\Sigma 4$, $\Delta\Sigma 5$, $\Delta\Sigma 6$ and $\Delta\Sigma 7$ operate. This correction signal could be individually subtracted from the digital response of each of the converters $\Delta\Sigma 1$, $\Delta\Sigma 2$, $\Delta\Sigma 3$, $\Delta\Sigma 4$, $\Delta\Sigma 5$, $\Delta\Sigma 6$ and $\Delta\Sigma 7$. However, in FIG. 2, the digital responses of these converters are time-division multiplexed by a multiplexer TDM to the minuend input part of subtracter SUB.

The time-division-multiplexed difference signals from subtracter SUB output port are shown applied to power monitoring circuitry PMC. In circuitry PMC the digitized voltage and current for each phase are latched at suitable times. Digital multiplication procedures are followed to develop indications of mean power in that phase. These indications of power in the three phases $P_A$, $P_B$ and $P_C$ may also be summed together to generate an indication $P_7$ of the total mean power in the three phases.

Certain of the time-division-multiplexed signals from subtracter SUB output port may be selected as input signal to trip generating circuitry TGC, notably the digitized response to phase currents and neutral current as provided by analog-to-digital converters $\Delta\Sigma 2$, $\Delta\Sigma 4$, $\Delta\Sigma 6$ and $\Delta\Sigma 7$. The absolute values of these responses over given periods of time are compared to threshold values in the trip generating circuitry TGC in order to generate trip signals responsive to overcurrent conditions.

An error that is observed in the FIG. 2 circuitry when correction signal is not applied as subtrahend signal to subtracter SUB from converter ΔΣ0 is attributable to the secondary current of the transformers VTA, VTB, VTC, CTA, CTB, CTC and CTN causing voltage drop variations in $V_{REF}$ because the source impedance of potential divider PD is not zero-valued. This error appears as crosstalk between the digitized responses of converters ΔΣ1, ΔΣ2, ΔΣ3, ΔΣ4, ΔΣ5, ΔΣ6 and ΔΣ7. Applying correction signal from converter ΔΣ0 to the subtrahend input port of the subtractor SUB suppresses this crosstalk. This is in addition to the suppression of $V_{REF}$ errors originally appearing or arising with temperature change or passage of time.

Signed, single-ended, delta-sigma converters are known that differ from those shown in FIG. 1 in that Q output connection of data flip-flop DFF1 connects back to the non-inverting input connection of operational amplifier OA1 via a feedback resistor and in that voltage source VS is relocated to apply $V_{REF} + V_{IN}$ to the non-inverting input connection of operational amplifier OA1. The systematic error evidenced in such a variant of delta-sigma converter ΔΣ1 can be compensated for using an appropriate variant of delta-sigma converter ΔΣ0, it should be evident from the foregoing disclosure. Signed, single ended, delta-sigma converters similar to ΔΣ1 and ΔΣ0 converters in FIG. 1, except for reversal of the + and − input connections to each of comparators CMP1 and CMP0, and except for reversal of the Q and $\overline{Q}$ output connections from each of data flip flops DFF1 and DFF0 as well, can be used in practicing the invention. One skilled in the art and acquainted with the foregoing disclosure is accordingly enabled to design other embodiments of the invention, and this should be borne in mind when construing the scope of the claims which follow.

What is claimed is:

1. In combination:

first and second oversampling analog-to-digital converters of signed, single-ended, delta-sigma type, which are similar to each other in respective operating characteristics, have respective input ports each having a respective reference terminal and a respective input terminal, and have respective output ports;

means for applying between the reference and input terminals of said first analog-to-digital converter an input signal to be digitized;

means for applying a reference voltage to the reference terminals of said first and second analog-to-digital converters and to the input terminal of said second analog-to-digital converter; and a digital subtractor having input ports connecting to separate ones or output ports of said first and second analog-to-digital converters and having an output port from which digitized response to said input signal is available.

2. A method for performing oversampled analog-to-digital conversion of an input signal to generate a conversion result signal essentially free of systematic errors, said method comprising the steps of:

performing oversampled analog-to-digital conversion of said input signal having a systematic error signal to generate a preliminary conversion result, performing oversampled analog-to-digital conversion of a zero-valued signal to generate a correction signal essentially consisting of a corresponding systematic error, and differentially combining digitally said correction signal and said preliminary conversion result signal to generate said conversion result signal essentially free of systematic errors.

* * * * *